United States Patent [19]

Yanase

[11] Patent Number: 4,766,678

[45] Date of Patent: Aug. 30, 1988

[54] VERTICAL APPARATUS FOR HEAT TREATING A SEMICONDUCTOR SUBSTRATE

[75] Inventor: Toshinobu Yanase, Ooita, Japan

[73] Assignee: Kabushiki Kaisha Toshiba, Kawasaki, Japan

[21] Appl. No.: 87,806

[22] Filed: Aug. 21, 1987

[30] Foreign Application Priority Data

Sep. 8, 1986 [JP] Japan .................................. 61-210993

[51] Int. Cl.[4] .............................................. F26B 19/00
[52] U.S. Cl. ........................................... 34/229; 34/38
[58] Field of Search .................... 34/38, 218, 229, 242

[56] References Cited

U.S. PATENT DOCUMENTS 4,724,621 2/1988 Hobson et al. ......................... 34/218

OTHER PUBLICATIONS

Japanese Patent Disclosure (Kokai) No. 58-78423.

Primary Examiner—Steven E. Warner
Attorney, Agent, or Firm—Finnegan, Henderson, Farabow, Garrett and Dunner

[57] ABSTRACT

A vertical apparatus for heat treating a semiconductor apparatus which is provided with an opening at one end, wherein the opening of a reactor provided with a reaction gas inlet and outlet is fitted with a cap which is designed to be tightly fitted to or removed from the reactor opening, a boat rest is mounted on the cap, when the cap shuts the reactor opening, the reaction gas drawn off from the inlet is carried to the outside through the outlet, when the cap is removed from the reactor opening, a gas is carried from the inlet provided in the boat rest to the outlet at the predetermined rate, and the gas passing through the gas introducing passage and gas-discharging passage provided in the boat rest prevents the open air from flowing backward into the reactor opening.

4 Claims, 2 Drawing Sheets

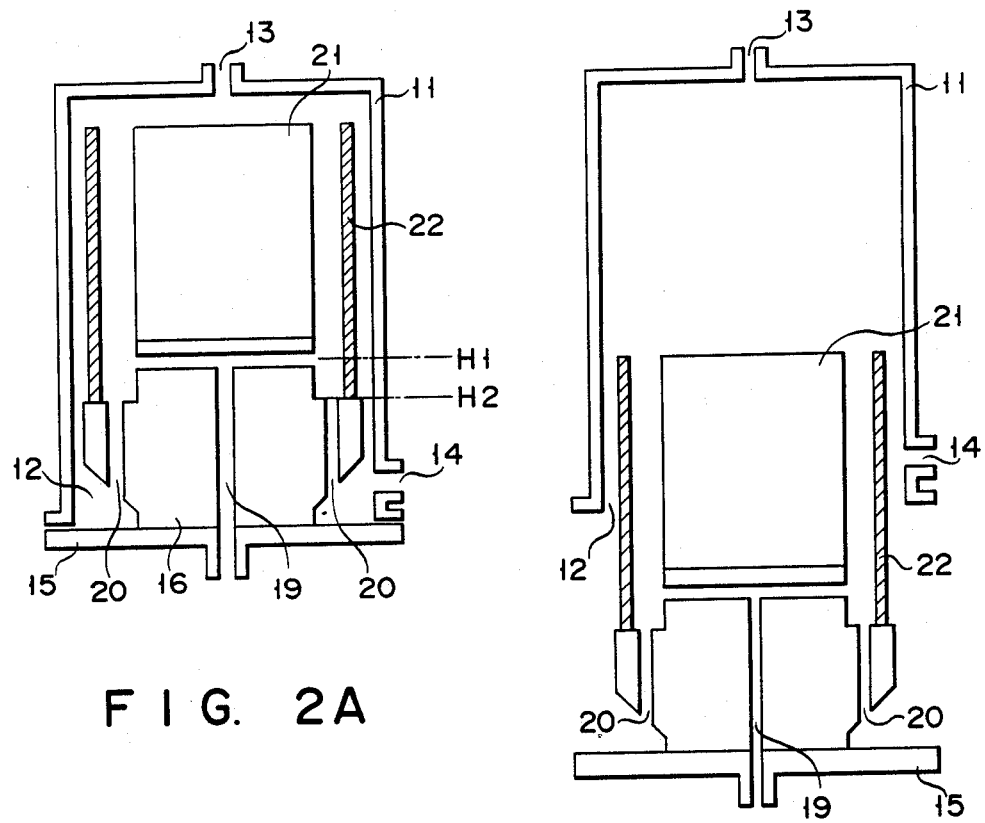
FIG. 2A
FIG. 2B
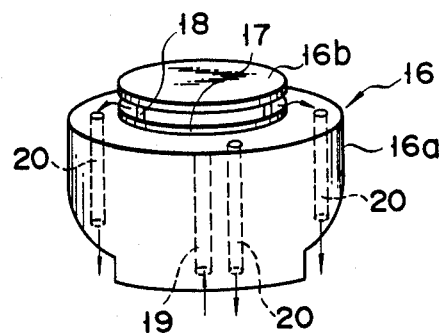
FIG. 3

4,766,678

VERTICAL APPARATUS FOR HEAT TREATING A SEMICONDUCTOR SUBSTRATE

BACKGROUND OF THE INVENTION

This invention relates to a vertical apparatus for heat treating a semiconductor substrate.

A heat-treating apparatus for a semiconductor substrate applied until now involves horizontal ard vertical types. The vertical heat-treating apparatus is classified into two types:

the type wherein an opening for enabling a wafer-carrying boat to be taken into and out of the reactor is formed in the upper portion of the heat-treating apparatus; and the type wherein said opening is perforated in the lower portion of said apparatus.

In the vertical heat-treating apparatus whose upper portion is perforated by an opening, an air curtain for releasing a large volume of gas is provided near the opening. When the wafer-carrying boat is taken into and out of the reactor, the curtain is intended to suppress the backward flow of the outside air into the reactor at the opening. However, even the air curtain provided near the opening fails to completely stop the backward flow of the outside air. Further, the application of a large volume of gas is accompanied with many drawbacks, for instances, the introduction of large volumes of highly heated gas into the cooling room. The vertical heat-treating apparatus whose lower portion is perforated by an opening has the merit that since the outside air having a lower temperature than the gas held in the reactor has a greater density, the backward flow of the outside air into the reactor can be prevented by the influx of a small volume of gas into the reactor. With this type of a semiconductor substrate-heating apparatus, the boat is surrounded by a cylinder to shut off the outside air, or in some cases, the reaction gas is let to run down the reactor. At any rate, gas has to flow through the reactor in a larger amount than prescribed. With the vertical type heating apparatus, however, it is practical and sufficient to let gas flow in a far smaller volume than in the horizontal type apparatus. Now let it be assumed that the opening has a diameter of 300 mm. Then it is necessary to let gas run at the rate of 20 l/min. Both the heat-treating apparatus whose upper portion is perforated by an opening and the type whose lower portion is provided with an opening are characterized in that the region uniformly heated to an elevated temperature is spaced apart from the opening at a short distance. When the gas flow rate is prominently increased, the temperature near the opening rises. Therefore, care should be taken about the quality and heat resistance of the walls of the heat treating apparatus of a semiconductor substrate. Discharge of large volumes of highly heated gas into a clean room raises various problems including heat load. Consequently there is a demand to minimize the gas flow rate and prevent the back flow of open air.

FIGS. 1A and 1B are sectional views of a vertical semiconductor substrate heat treating apparatus whose lower portion is perforated by an opening. Reactor 1 comprises an opening. The top wall of reactor 1 is provided with reaction gas inlet 3. Gas outlet 4 is provided at the lower part of the side wall of reactor 1. Aperture 2 of reactor 1 is fitted with vertically movable cap 5. Aperture 2 is opened or closed according to the movement of cap 5. Boat rest 6 is set on cap 5. Positioned on boat rest 6 is boat 7 designed to horizontally hold a plurality of wafers (not shown). Boat rest 6 is intended to hold boat 7 effectively in a uniformly heated region a to shut off heat released from reactor 1, thereby suppressing temperature rise in cap 5. Cylindrical jacket 8 surrounding boat 7 is mounted on boat rest 6. Gas outlet 9 is provided in the lower portion of one side wall of jacket 8 to prevent reaction gas from being retained in jacket 8.

A vertical semiconductor substrate heat treating apparatus constructed as described above is operated in the following manner. Reaction gas enters the reactor at inlet 3. The reactor gas taken into reactor 1 flows around boat 7 and then through outlet 9 of jacket 8 and further through outlet 4 of reactor 1 and finally into the open air (FIG. 1A).

After heat treatment, cap 5 is let to fall (FIG. 1B). At this time aperture 2 of reactor 1 is exposed to outside air. Boat 7 is shut off from the outside air by jacket 8. If an interstice between reactor 1 and jacket 8 is extremely narrow and has an extremely small sectional area, reaction gas is also released through outlet 9 of jacket 8. Therefore, the outside air is prevented from entering jacket 8. Practically, however, it is necessary to allow a certain interstice between reactor 1 and jacket 8 in order to facilitate the vertical movement of jacket 8. Therefore, reaction gas is fully released through an interstice between reactor 1 and jacket 8 and outlet 4 of reactor 1. As a result, it sometime happens that reaction gas finals to fully flow to outlet 9, thus giving rise to the backward flow of outside air, and consequently sometimes deteriorating the property of a finished semiconductor element, particularly the voltage property of a flat band.

SUMMARY OF THE INVENTION

This invention has been accomplished in view of the above-mentioned circumstances and is intended to provide a heat-treating apparatus which can produce a semiconductor apparatus whose elements have a satisfactory property.

To attain the above-mentioned object, the present invention provides a semiconductor substrate heat-treating apparatus, which comprises:

a reactor, one side wall of which is perforated by an aperture allowing for the insertion and withdrawal of a boat and which is also provided with the inlet and outlet for a reaction gas;

a cap fitted to the reactor opening so as to be freely opened and closed;

a boat rest provided with a gas inlet and gas outlet; and a boat mounted on the boat rest so as to horizontally hold a wafer.

The semiconductor substrate heat-treating apparatus embodying the present invention is characterized as follows. When cap is let to fall, the gas inlet and outlet set at the predetermined position of boat rest cause gas having a temperature lower than a reaction gas but higher than room temperature to flow from inlet to outlet. The gas brought through inlet has a lower temperature than the reaction gas, and is not carried into the reactor but discharged through outlet. Therefore the open air is prevented from entering the reactor. The flow rate of reaction gas is reduced when the boat is taken into and out of the reactor. Therefore, the gas flow rate near the reactor opening is reduced, and the temperature near the reactor opening is decreased. Consequently, it is unnecessary to consider the material and heat resistance property of the wall of the subject semiconductor substrate heat-treating apparatus and the paint applied thereto. An interstice between the jacket and reactor can be widened thereby to allow a broader margin for the vertical movement of boat rest. The gas brought through gas inlet of boat rest is not heated by reactor, but is a low temperature gas heated by boat rest, thus mininizing the heat effect appearing near reactor aperture. Further, the heat load of a clean room does not undergo great stresses.

BRIEF DESCRIPTION OF THE DRAWINGS

FIG. 2A is a sectional view of the semiconductor substrate heat treating apparatus while performing heat treatment;

FIG. 2B is a sectional view of the semiconductor substrate heat treating apparatus after the heat treatment; and FIG. 3 is an oblique view of the boat rest of the semiconductor substrate heat treating apparatus embodying the present invention indicated in FIGS. 2A and 2B.

DETAILED DESCRIPTION OF THE PREFERRED EMBODIMENTS

Figures 1A, 1B:
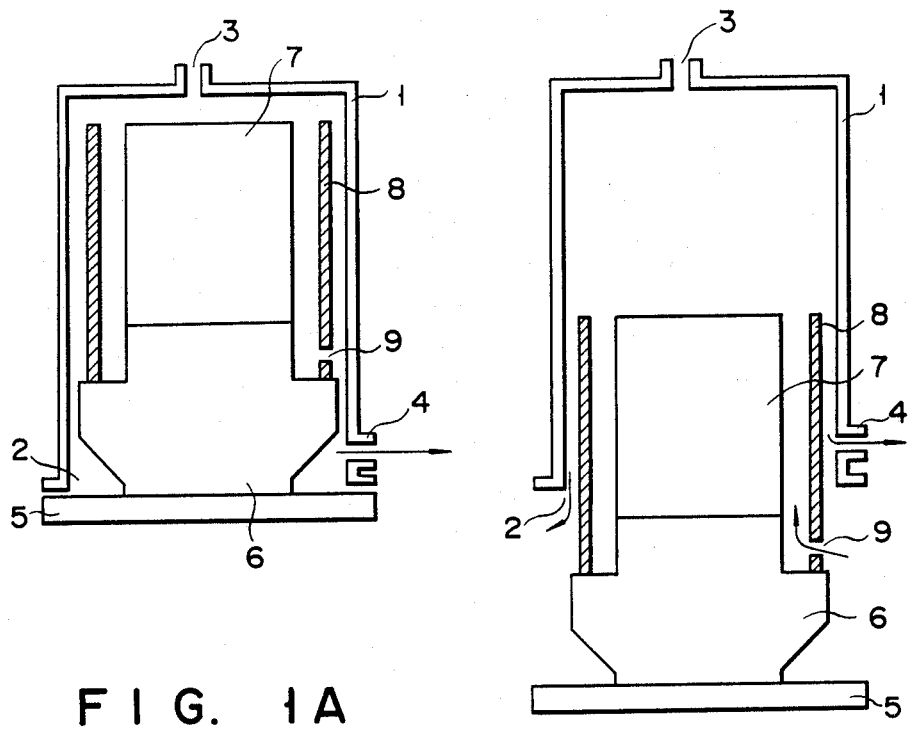
FIG. 1A is a sectional view of the conventional semiconductor substrate heat treating apparatus while performing heat treatment.
FIG. 1B is a sectional view of the conventional semiconductor substrate heat treating apparatus after completion of the heat treatment.

Description may now be made with reference to the appended drawings of a semiconductor substrate heat treating apparatus representing this invention. Reactor 11 is provided with opening 12 in the lower portion. Reaction gas inlet 13 is perforated in the top surface of reactor 11. Gas outlet 14 is formed in the lower portion of one-side wall of rector 11. Opening 12 of reactor 11 is fitted with vertically movable cap 15. Opening 12 of reactor 11 is opened and closed when vertical movable cap 15 is moved downward and upward. Boat rest 16 is set on cap 15. Boat rest 16 is intended to hold later-described boat 21 efficiently in the uniform heating region or to shut off heat released from reactor 11, thereby preventing the temperature rise of cap 15. As shown in FIG. 3, boat rest 16 comprises cylindrical member 16a, whose upper surface is provided with cylindrical projection 17, and disc 16b positioned above cylindrical member 16a with upright support rods interposed therebetween.

Holes penetrate cylindrical member 16a in the axial direction. A void space formed jointly by penetrating holes, disk 16b and cylindrical member 16a gas inlet 19. Penetrating holes (gas discharge passage) 20, for example, four in number, perforate the peripheral portion of cylinder 16a in its axial direction.

Gas outlet 41 of gas-introducing passage 19 is positioned higher than gas inlet 42 of gas-discharging passage 20. Placed on a disc 16b of boat rest 16 is a boat intended to horizontally hold a plurality of wafers (not shown). Cylindrical jackets 22 are formed along the peripheral edge of cylinder 16a so as to surround gas discharge passage 20.

Description will now be made of the heat treatment performed in the semiconductor substrate heat-treating apparatus of the present invention constructed as described above. Reaction gas enters reactor 11 at inlet 13 and flows around boat 21. Later, reaction gas runs through gas discharge passage 20 of boat rest 16 and then through discharge port 14 of reactor 11 into the open air.

When cap 15 is brought down after heat treatment, opening 12 of reactor 11 is exposed to the open air. However, boat 21 which is surrounded by jacket 22 is not directly exposed to the open air.

If the reaction gas flows in large amounts, or only a narrow interstice is allowed between reactor 11 and jacket 22, no difficulties arise as in the conventional semiconductor substrate heat-treating apparatus. When, however, the flow rate of the reaction gas is small, or a broad interstice arises between reactor 11 and jacket 22, the following condition arises. Namely, if a gas having a lower temperature than the reaction gas and yet a higher temperature than the open air is allowed to flow through gas-introducing passage 19 of boat rest 16 at the rate of, for example, 5 l/min, then the temperature difference causes said gas to a fill jacket 22 instead of entering reactor 11 and to be drawn off through discharge passage 20 of boat rest 16.

Even if, therefore, a broad interstice should arise between reactor 11 and jacket 22, no back flow of the open air takes place. The minimum flow rate (l/min) of a gas drawn off from gas-introducing passage 19 can be considerably reduced, because the object is sufficiently served, provided said flow rate can be represented by the following formula:

Inside sectional area of jacket (cm$^2$ × cap falling velocity cm/min$\alpha$1000)+$\alpha$.

What is claimed is:

1. A semiconductor substrate heat treating apparatus which comprises:
    a reactor provided with an opening on one side allowing for the insertion and withdrawal of a boat and the inlet and outlet of a reaction gas;
    a cap provided at the opening of the reactor so as to be fitted to or removed from said opening;
    a boat rest provided with a gas inlet and outlet and mounted on the cap; and
    a boat mounted on the boat rest so as to horizontally hold wafers.

2. The heat treating apparatus according to claim 1, wherein the outlet of a gas-introducing passage is positioned higher than the inlet of a gas-discharging passage.

3. The heat treating apparatus according to claim 1, wherein a cylindrical jacket is provided around the peripheral edge of the boat rest so as to shut off the boat from the open air.

4. The heat treating apparatus according to claim 1, wherein a gas entering through the gas-introducing passage has a lower temperature than the reaction gas held in the reactor.

* * * * *